US008729405B2

(12) United States Patent
Ishida et al.

(10) Patent No.: US 8,729,405 B2
(45) Date of Patent: May 20, 2014

(54) WIRING BOARD AND METHOD FOR MANUFACTURING THE SAME

(75) Inventors: Atsushi Ishida, Ogaki (JP); Ryojiro Tominaga, Ogaki (JP); Haruhiko Morita, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 166 days.

(21) Appl. No.: 13/053,644

(22) Filed: Mar. 22, 2011

(65) Prior Publication Data

US 2011/0284282 A1 Nov. 24, 2011

Related U.S. Application Data

(60) Provisional application No. 61/319,575, filed on Mar. 31, 2010.

(51) Int. Cl.
*H05K 1/11* (2006.01)
(52) U.S. Cl.
USPC .............................. 174/262; 174/266; 174/261
(58) Field of Classification Search
USPC .......................................... 174/261, 262, 266
See application file for complete search history.

(56) References Cited

U.S. PATENT DOCUMENTS

| 6,388,206 | B2 * | 5/2002 | Dove et al. ..................... 174/262 |
| 7,742,314 | B2 * | 6/2010 | Urashima et al. ............. 361/793 |
| 8,110,749 | B2 * | 2/2012 | Yoshimura et al. ........... 174/260 |
| 8,212,154 | B2 * | 7/2012 | Kashiwakura ................. 174/262 |
| 2006/0021794 | A1 * | 2/2006 | Cheng ............................ 174/264 |
| 2009/0133913 | A1 * | 5/2009 | Kushta et al. .................. 174/260 |
| 2011/0048775 | A1 | 3/2011 | Ishida et al. |

FOREIGN PATENT DOCUMENTS

JP 2002-204075 7/2002

OTHER PUBLICATIONS

U.S. Appl. No. 12/956,826, filed Nov. 30, 2010, Ishida, et al.
U.S. Appl. No. 12/956,753, filed Nov. 30, 2010, Morita, et al.
U.S. Appl. No. 12/952,864, filed Nov. 23, 2010, Ishida, et al.

* cited by examiner

*Primary Examiner* — Hoa C Nguyen
*Assistant Examiner* — Amol Patel
(74) *Attorney, Agent, or Firm* — Oblon, Spivak, McClelland, Maier & Neustadt, L.L.P.

(57) ABSTRACT

A printed wiring board wiring board including a substrate having a first penetrating hole and multiple second penetrating holes formed around the first penetrating hole, a first conductive portion and a second conductive portion formed on one surface of the substrate, a third conductive portion and a fourth conductive portion formed on the opposite surface of the substrate, a first through-hole conductor formed in the first penetrating hole and connecting the first conductive portion and the third conductive portion, and multiple second through-hole conductors formed in the second penetrating holes and connecting the second conductive portion and the fourth conductive portion. The first through-hole conductor and the second through-hole conductors are made of conductive material filled in the first penetrating hole or the second penetrating holes.

19 Claims, 19 Drawing Sheets

1

WIRING BOARD AND METHOD FOR MANUFACTURING THE SAME

CROSS-REFERENCE TO RELATED APPLICATIONS

The present application claims the benefits of priority to U.S. Application No. 61/319,575, filed Mar. 31, 2010. The contents of that application are incorporated herein by reference in their entirety.

BACKGROUND OF THE INVENTION

1. Field of the Invention

The present invention relates to a wiring board and its manufacturing method.

2. Discussion of the Background

In Japanese Laid-Open Patent Publication No. 2002-204075, through holes with a coaxial structure are described. In Japanese Laid-Open Patent Publication No. 2002-204075, two plating processes form a coaxial through-hole structure; a plating process for forming an outer through-hole conductor, and a plating process for forming an inner through-hole conductor. Namely, to form an outer through-hole conductor, plating is performed on the inner wall of a penetrating hole for an outer through hole formed in a core substrate, and then, to form an inner through-hole conductor, plating is performed on the inner wall of a penetrating hole for an inner through hole. The contents of Japanese Laid-Open Patent Publication No. 2002-204075 are incorporated herein by reference in their entirety in this application.

SUMMARY OF THE INVENTION

According to one aspect of the present invention, a wiring board includes a substrate having a first penetrating hole and multiple second penetrating holes formed around the first penetrating hole, a first conductive portion formed on a surface of the substrate and positioned at one end of the first penetrating hole, a second conductive portion formed on the surface of the substrate and positioned at one ends of the second penetrating holes around the first conductive portion, a third conductive portion formed on the opposite surface of the substrate and positioned at the opposite end of the first penetrating hole, a fourth conductive portion formed on the opposite surface of the substrate and positioned at the opposite ends of the second penetrating holes around the third conductive portion, a first through-hole conductor formed in the first penetrating hole and having a conductive material filling the first penetrating hole of the substrate, the first through-hole conductor electrically connecting the first conductive portion and the third conductive portion, and multiple second through-hole conductors formed in the second penetrating holes and having a conductive material filling the second penetrating holes, the second through-hole conductors electrically connecting the second conductive portion and the fourth conductive portion.

According to another aspect of the present invention, a method for manufacturing a wiring board includes preparing a substrate, forming a first penetrating hole through the substrate, forming multiple second penetrating holes through the substrate around the first penetrating hole, forming on a surface of the substrate a first conductive portion, forming on the surface of the substrate a second conductive portion positioned around the first conductive portion, forming on the opposite surface of the substrate a third conductive portion, forming on the opposite surface of the substrate a fourth conductive portion positioned around the third conductive portion, filling a conductive material in the first penetrating hole such that a first through-hole conductor connecting the first conductive portion and the third conductive portion is formed in the first penetrating hole, and filling a conductive material in the second penetrating holes such that multiple second through-hole conductors connecting the second conductive portion and the fourth conductive portion are formed in the second penetrating holes, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
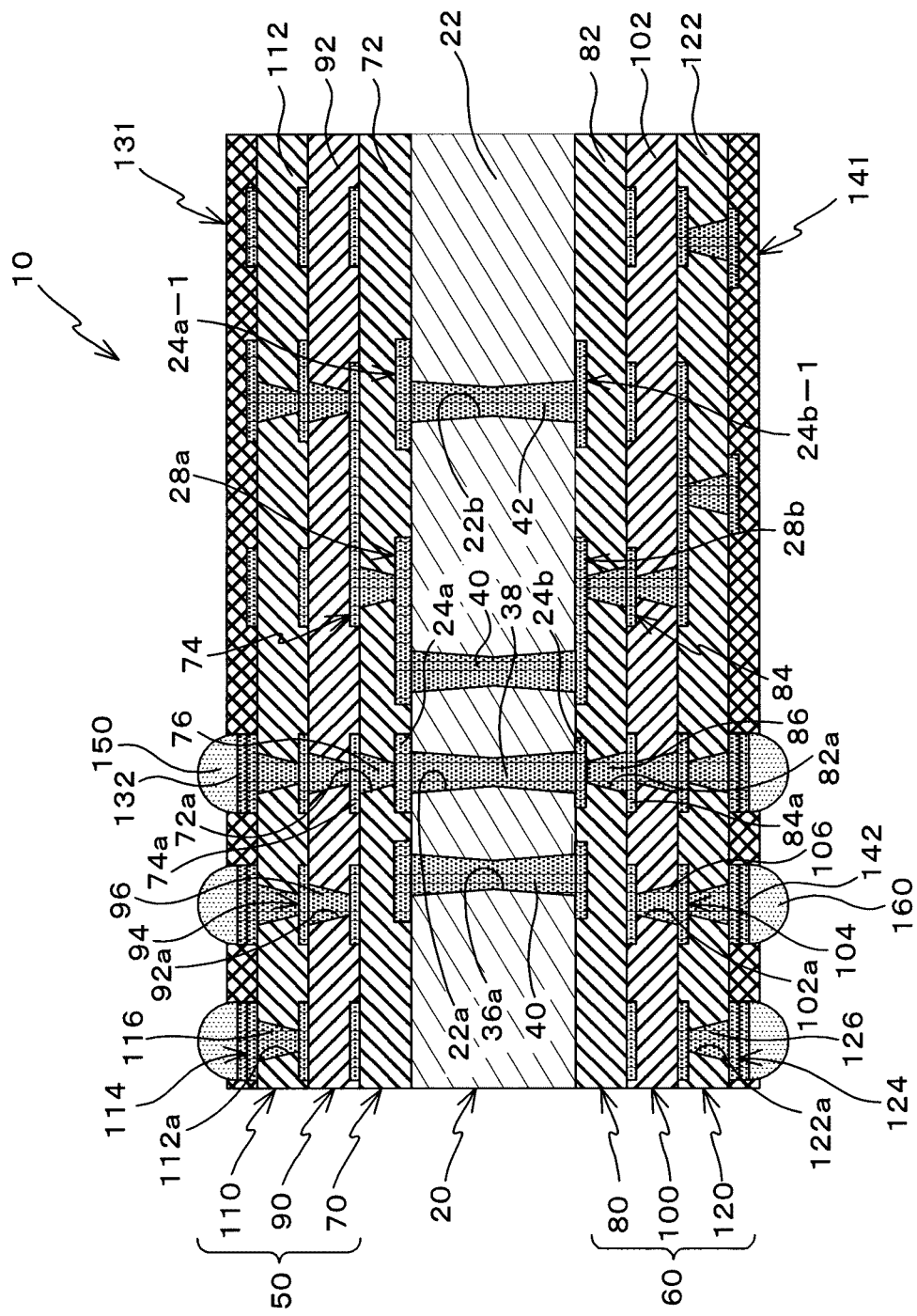
FIG. 1 is a cross-sectional view of a wiring board according to an embodiment of the present invention.

The embodiments will now be described with reference to the accompanying drawings, wherein like reference numerals designate corresponding or identical elements throughout the various drawings.

Wiring board 10 of the present embodiment is a printed wiring board. As shown in FIG. 1, wiring board 10 has core substrate 20, buildup layers (50, 60), solder-resist layers (131, 141), and external connection terminals (150, 160) made of solder.

Core substrate 20 has insulative substrate 22, first conductive portion (24a), third conductive portion (24b), second conductive portion (28a) and fourth conductive portion (28b), which are made of copper, for example, multiple outer through-hole conductors 40 and inner through-hole conductor 38. Outer through-hole conductors 40 are positioned at substantially even intervals in a circumferential direction with the central axis of inner through-hole conductor 38 at their center. First conductive portion (24a) and second conductive portion (28a) are formed on a first surface of insulative substrate 22, and third conductive portion (24b) and fourth conductive portion (28b) are formed on a second surface of insulative substrate 22.

Insulative substrate 22 is made of epoxy resin, for example. Epoxy resin is preferred to contain reinforcing material such as glass fiber (glass fabric or glass non-woven fabric, for example) and aramid fiber (aramid non-woven fabric, for example) impregnated with resin. The material for insulative substrate 22 is not limited specifically. The reinforcing material has a smaller thermal expansion coefficient than a primary material (epoxy resin in the present embodiment).

In insulative substrate 22, first penetrating hole (22a) is formed, penetrating from the first surface of core substrate 20 through the second surface. The cross section of the opening shape of first penetrating hole (22a) is circular, for example.

Plating is filled in first penetrating hole (22a). By filling plating, inner through-hole conductor 38 (first through-hole conductor) is formed. Namely, inner through-hole conductor 38 is formed to be substantially cylindrical. Here, plating indicates depositing a layer of conductor (such as metal) on a surface of metal, resin or the like, as well as the deposited conductive layer (such as a metal layer). In addition, plating includes wet plating such as electrolytic plating and electroless plating and dry plating such as PVD (Physical Vapor Deposition) and CVD (Chemical Vapor Deposition). Inner through-hole conductor 38 is preferred to be made of copper plating because of its small electrical resistance.

Cover like first conductive portion (24a) and third conductive portion (24b) are formed on inner through-hole conductor 38 to cover its top and bottom surfaces. First conductive portion (24a) and third conductive portion (24b) are made of copper foil and a plated layer. First conductive portion (24a) and third conductive portion (24b) are positioned opposite each other and sandwich inner through-hole conductor 38. Then, first conductive portion (24a) and third conductive portion (24b) are electrically connected by inner through-hole conductor 38.

As shown in FIGS. 2A through 2H, second penetrating holes (36a) which penetrate from the first surface of core substrate 20 through the second surface are formed outside (around) inner through-hole conductor 38. The cross section of the opening shape of second penetrating holes (36a) is substantially circular, for example.

Plating is filled in second penetrating holes (36a). By filling plating, outer through-hole conductors 40 are formed. Namely, outer through-hole conductors 40 are formed to be substantially cylindrical. Outer through-hole conductors 40 are preferred to be made of copper plating because of its small electrical resistance. Multiple outer through-hole conductors 40 are formed around inner through-hole conductor 38.

On the first surface of core substrate 20, second conductive portion (28a) is formed to cover top surfaces of multiple outer through-hole conductors 40. Also, on the second surface of core substrate 20, fourth conductive portion (28b) is formed to cover the bottom surfaces of multiple outer through-hole conductors 40.

Second conductive portion (28a) and fourth conductive portion (28b) are connected by outer through-hole conductors 40.

On the first surface of core substrate 20, the surface of first conductive portion (24a) and the surface of second conductive portion (28a) are positioned on substantially the same plane. Also, on the second surface of core substrate 20, the surface of third conductive portion (24b) and the surface of fourth conductive portion (28b) are positioned on substantially the same plane.

In the following, through holes in core substrate 20 are described with reference to FIGS. 2A through 2H. Here, a simplified version of through holes is used although they are formed to be narrower in their central portions as shown in FIG. 1. In wiring board 10 of the present embodiment, six outer through-hole conductors 40 are positioned at substantially even intervals around inner through-hole conductor 38 as shown in a schematic view in FIG. 2A. First conductive portion (24a) is formed on the top surface of inner through-hole conductor 38, and third conductive portion (24b) is formed on its bottom surface. First conductive portion (24a) and third conductive portion (24b) are positioned opposite each other and sandwich inner through-hole conductor 38. Also, on the top surfaces of outer through-hole conductors 40, substantially annular second conductive portion (28a) is formed to surround first conductive portion (24a), and on the bottom surfaces, substantially annular fourth conductive portion (28b) is formed to surround third conductive portion (24b). Second conductive portion (28a) and fourth conductive portion (28b) are positioned opposite each other and sandwich outer through-hole conductors 40.

Figure 2A:
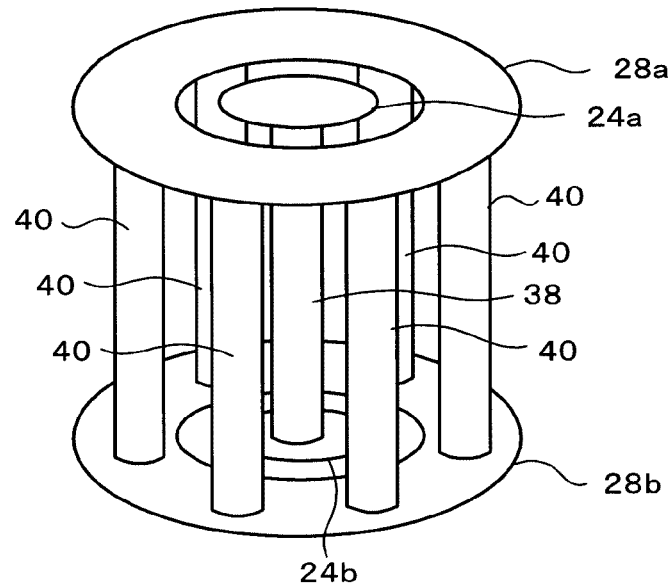
FIG. 2A is a view schematically showing through holes in a core substrate.
Figure 2B:
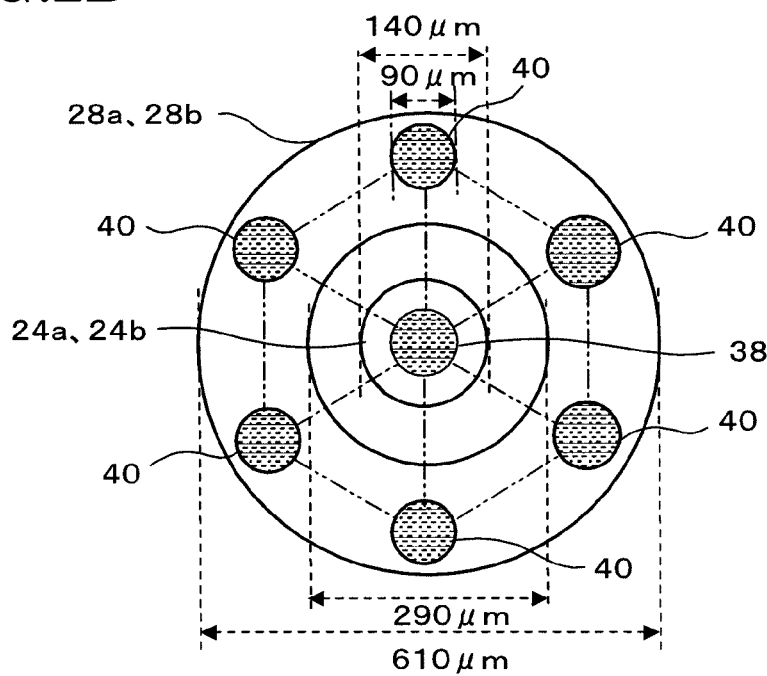
FIG. 2B is a view showing positions of the through holes in a core substrate.

In the present embodiment, as shown in a schematic view in FIG. 2B, six outer through-hole conductors 40 are positioned at substantially even intervals along the external circumference of second conductive portion (28a) and fourth conductive portion (28b) with inner through-hole conductor 38 positioned at their center. Accordingly, outer through-hole conductors 40 are arranged at positions corresponding to the apexes of a regular hexagon.

Here, if the direction of current flowing in outer through-hole conductors 40 and the direction of current flowing in inner through-hole conductor 38 are set opposite from each other, part of the magnetic fields generated by the current flowing in outer through-hole conductors 40 is offset from part of the magnetic fields generated by the current flowing in inner through-hole conductor 38. The greater the number of outer through-hole conductors 40, the more such effects occur.

The diameters of outer through-hole conductors 40 and inner through-hole conductor 38 are each measured at 90 μM, for example. The external diameters of first conductive portion (24a) and third conductive portion (24b) are each measured at 140 μm, for example. The inner diameters of second conductive portion (28a) and fourth conductive portion (28b) are each measured at 290 μm, for example, and their external diameters are each measured at 610 μm, for example.

Figure 2C:
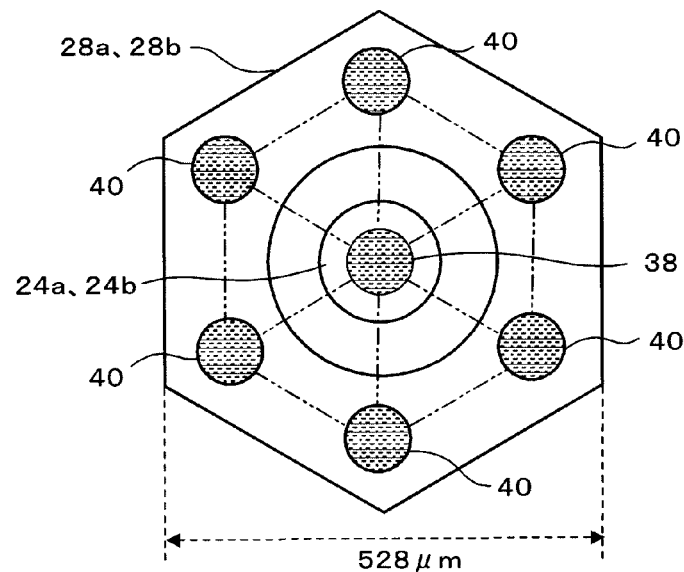
FIG. 2C is a view showing positions of the through holes in a core substrate.

The shape of second conductive portion (28a) and fourth conductive portion (28b) is not limited to being circular, and it may be polygonal, for example. Then, outer through-hole conductors 40 may be arranged at positions corresponding to the apexes of a polygon. Namely, as shown in FIG. 2C, second conductive portion (28a) and fourth conductive portion (28b) may be formed to be regular hexagons, for example. When second conductive portion (28a) and fourth conductive portion (28b) are formed as regular hexagons, the outer diameter (distance between opposite sides) of second conductive portion (28a) and fourth conductive portion (28b) is measured at 528 μm, for example.

In the present embodiment, six outer through-hole conductors 40 are positioned around inner through-hole conductor 38. However, any other number may be selected for outer through-hole conductors 40. If the number of outer through-hole conductors 40 increases, the pitch between outer through-hole conductors becomes narrower. Thus, the effect of shielding magnetic fields increases.

Figure 2D:
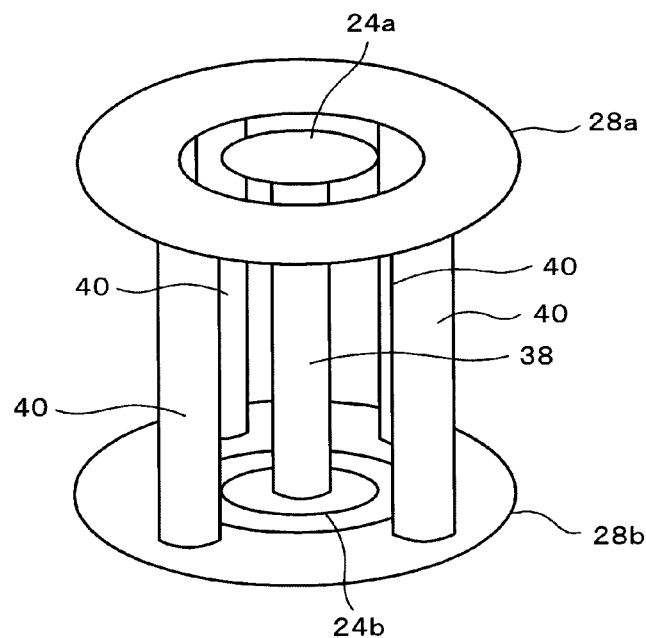
FIG. 2D is a view schematically showing through holes in a core substrate.

FIG. 2D is a view showing an example in which four outer through-hole conductors 40 are positioned at even intervals along the external circumferences of second conductive portion (28a) and fourth conductive portion (28b). In this example, virtual lines connecting the centers of outer through-hole conductors 40 form a square.

Figure 2E:
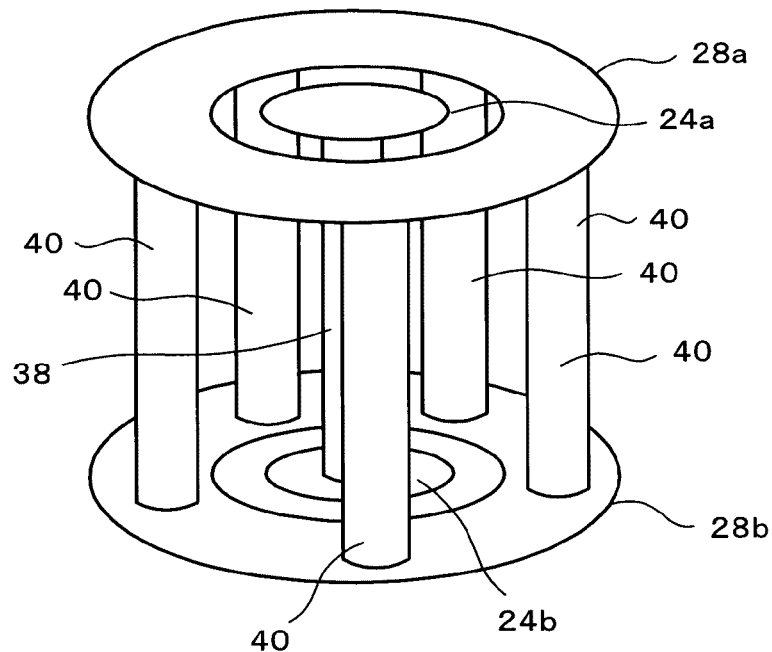
FIG. 2E is a view schematically showing through holes in a core substrate.

FIG. 2E is a view showing an example in which five outer through-hole conductors 40 are positioned at even intervals along the external circumferences of second conductive portion (28a) and fourth conductive portion (28b). In this example, virtual lines connecting the centers of outer through-hole conductors 40 form a regular pentagon.

Figure 2F:
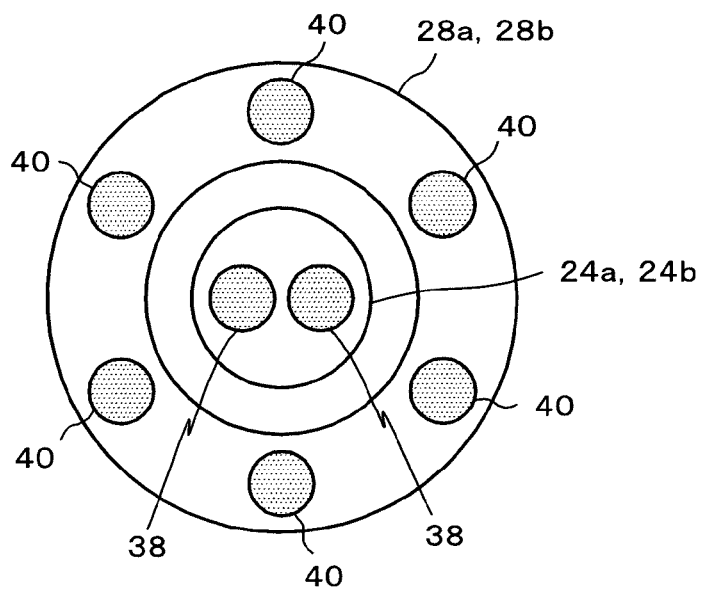
FIG. 2F is a view schematically showing through holes in a core substrate.

FIG. 2F is a view showing an example in which multiple (for example, two) inner through-hole conductors 38 are formed. In such an example, positions of inner through-hole conductors 38 are not limited specifically.

Figure 2G:
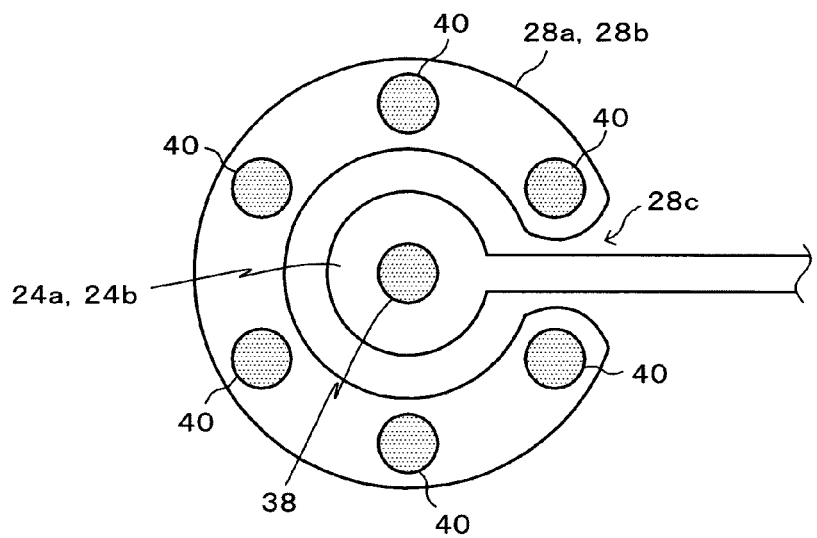
FIG. 2G is a view schematically showing through holes in a core substrate.
Figure 2H:
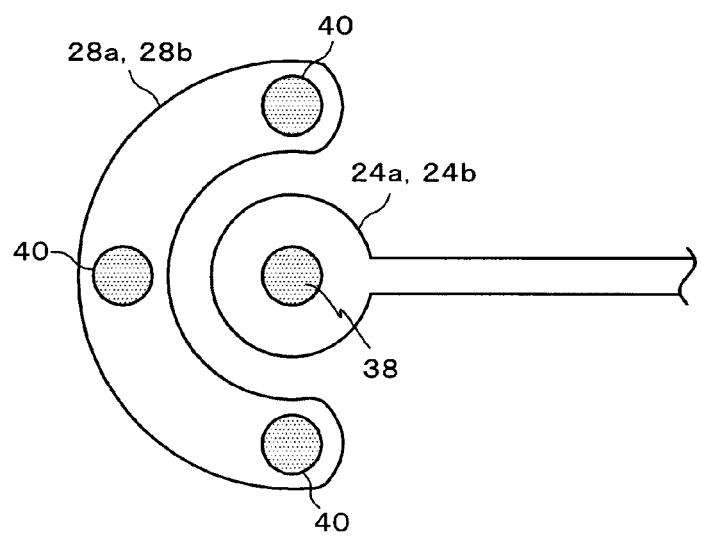
FIG. 2H is a view schematically showing through holes in a core substrate.

In addition, FIGS. 2G and 2H are views showing examples in which first conductive portion (24a) and third conductive portion (24b) are not completely surrounded by second conductive portion (28a) and fourth conductive portion (28b). FIG. 2G is a view showing an example in which notch portions (28c) are formed in first conductive portion (24a) and third conductive portion (24b) to distribute conductive circuits extended from second conductive portion (28a) and fourth conductive portion (28b). In such an example, the shape and positions of notch portions (28c) are not limited specifically. The positions and numbers of inner through-hole conductors 38 and outer through-hole conductors 40 are also not limited specifically.

FIG. 2H is a view showing an example in which second conductive portion (28a) and fourth conductive portion (28b) are formed substantially semicircular. The positions and numbers of inner through-hole conductors 38 and outer through-hole conductors 40 are also not limited specifically.

As described above, if the direction of current flowing in outer through-hole conductors 40 and the direction of current flowing in inner through-hole conductor 38 are set opposite from each other, part of the magnetic fields generated by the current flowing in outer through-hole conductors 40 is offset from part of the magnetic fields generated by the current flowing in inner through-hole conductor 38.

Figure 2I:
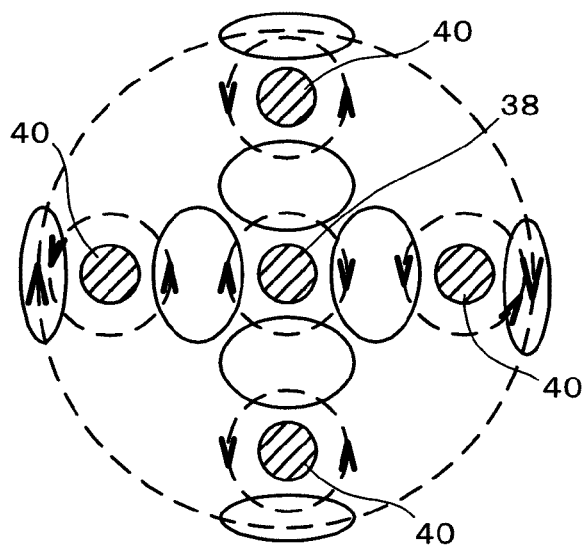
FIG. 2I is a view schematically showing magnetic fields generated in through holes in a core substrate.
Figure 2J:
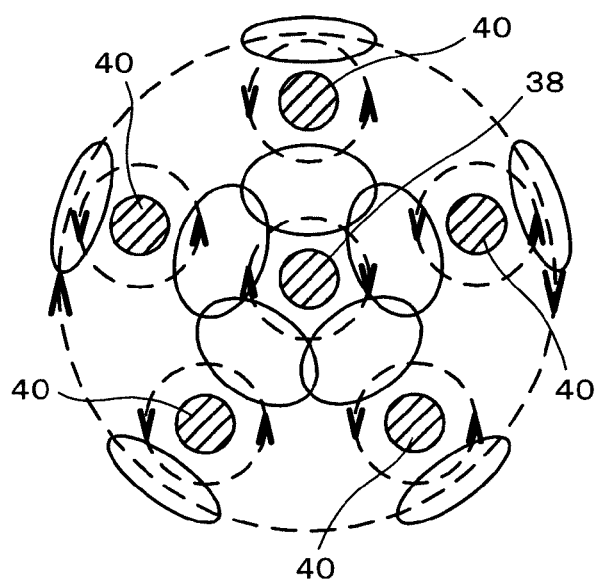
FIG. 2J is a view schematically showing magnetic fields generated in through holes in a core substrate.
Figure 2K:
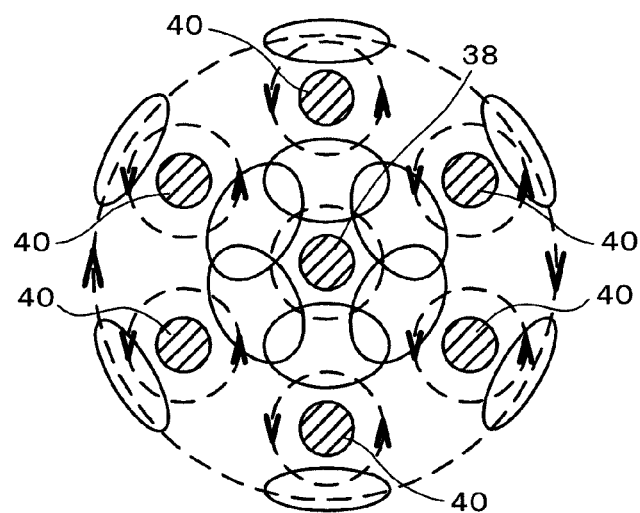
FIG. 2K is a view schematically showing magnetic fields generated in through holes in a core substrate.

FIG. 2I is a view showing the magnetic fields generated by the current flowing in outer through-hole conductors 40 and the magnetic fields generated by the current flowing in inner through-hole conductor 38 when second conductive portion (28a) and fourth conductive portion (28b) are connected by four outer through-hole conductors 40. FIG. 2J is a view showing the magnetic fields generated by the current flowing in outer through-hole conductors 40 and the magnetic fields generated by the current flowing in inner through-hole conductor 38 when second conductive portion (28a) and fourth conductive portion (28b) are connected by five outer through-hole conductors 40. FIG. 2K is a view showing the magnetic fields generated by the current flowing in outer through-hole conductors 40 and the magnetic fields generated by the current flowing in inner through-hole conductor 38 when second conductive portion (28a) and fourth conductive portion (28b) are connected by six outer through-hole conductors 40.

As seen in FIGS. 2I, 2J and 2K, the greater the number of outer through-hole conductors 40, the greater the percentage of generated magnetic fields that offsets the magnetic fields generated by the current flowing in inner through-hole conductor 38. Accordingly, shielding effects increase against the magnetic fields generated by the current flowing in inner through-hole conductor 38.

Figure 2L:
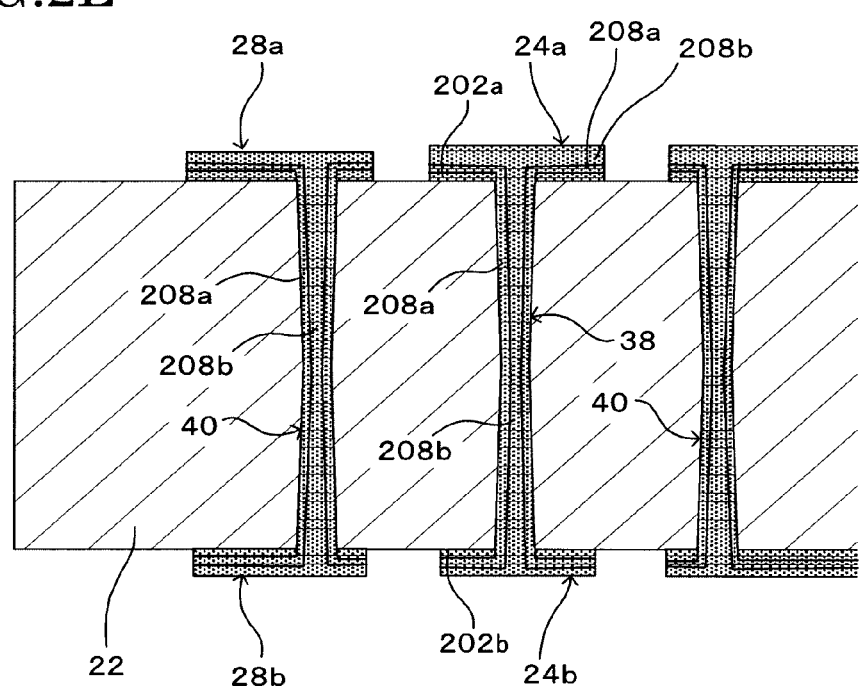
FIG. 2L is an enlarged cross-sectional view showing through holes in a core substrate.

Also, as shown in FIG. 2L, in wiring board 10 of the present embodiment, first conductive portion (24a), third conductive portion (24b), second conductive portion (28a) and fourth conductive portion (28b) are made up of copper foil (202a) formed on insulative substrate 22, electroless plated film (208a) formed on copper foil (202a) and electrolytic plated film (208b) formed on electroless plated film (208a). Inner through-hole conductor 38 and outer through-hole conductors 40 are made up of electroless plated film (208a) formed on the wall surfaces of penetrating holes in insulative substrate 22 and of electrolytic plated film (208b) filled in the space encapsulated by electroless plated film (208a).

The width of first conductive portion (24a) and third conductive portion (24b) is set greater than the width of inner through-hole conductor 38. The width of second conductive portion (28a) and fourth conductive portion (28b) is set greater than the width of outer through-hole conductors 40. First conductive portion (24a), third conductive portion (24b), second conductive portion (28a) and fourth conductive portion (28b) may be formed only with a plated cover layer (through-hole land) of a through-hole conductor, or they may be formed with a plated cover layer and a conductive circuit extended from the plated cover layer.

Moreover, the surface of first conductive portion (24a) and the surface of second conductive portion (28a) are positioned on substantially the same plane, and the surface of third conductive portion (24b) and the surface of fourth conductive portion (28b) are positioned on substantially the same plane.

According to wiring board 10 of the present embodiment, first penetrating hole (22a) and second penetrating holes (36a) formed around first penetrating hole (22a) may be simultaneously filled with plating. Therefore, inner through-hole conductor 38 and outer through-hole conductors 40 may be formed simultaneously altogether by one plating process. As a result, a simplified manufacturing process is achieved.

Furthermore, since second conductive portion (28a) and fourth conductive portion (28b) are connected by multiple outer through-hole conductors 40, cross-sectional areas of conductors actually increase even if through-hole conductors are set to have smaller diameters. Thus, impedance does not increase in the voltage-supply circuits including outer through-hole conductors. As a result, suppressing fluctuations in power-source voltage becomes easier and regular transistor operations are maintained.

Figure 3:
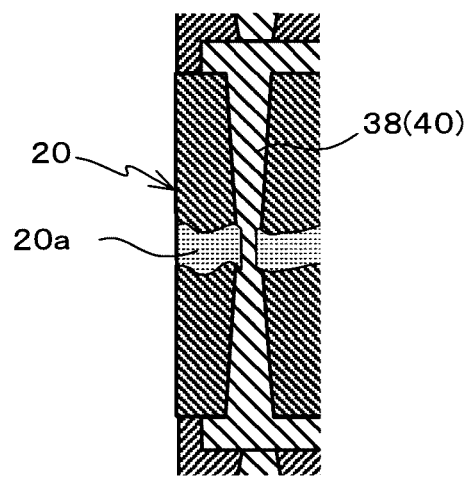
FIG. 3 is a cross-sectional view showing the inside structure of a through-hole.

As shown in FIG. 3, part of reinforcing material (20a) (such as glass fiber) protrudes into inner through-hole conductor 38 and outer through-hole conductors 40. Accordingly, tensile stress in directions Z (in lamination directions) is mitigated from being exerted on inner through-hole conductor 38 and outer through-hole conductors 40.

Figure 4A:
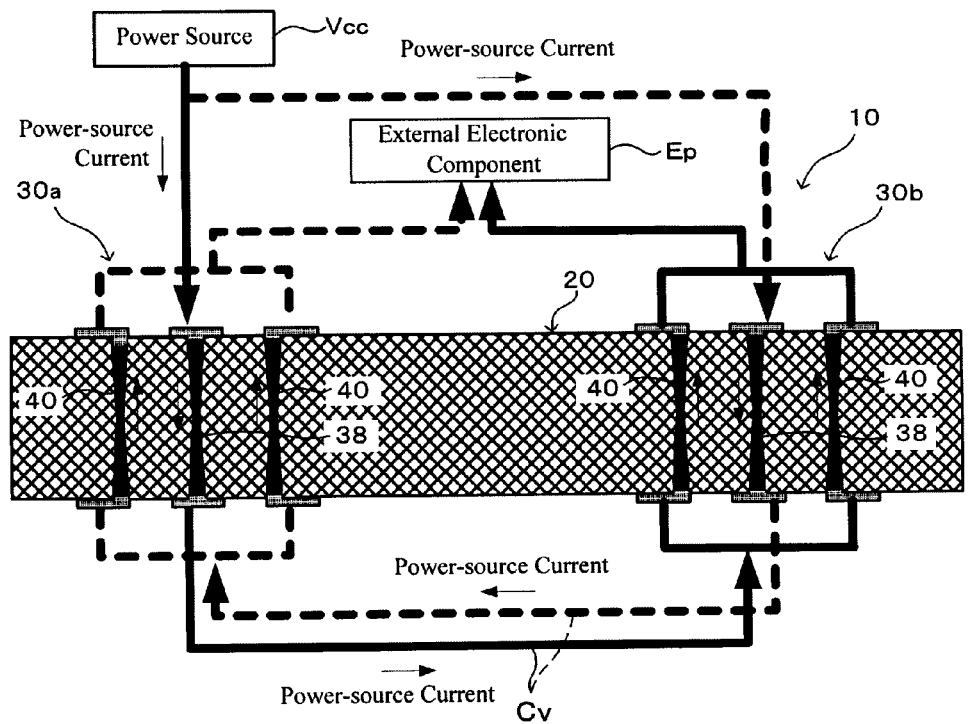
FIG. 4A is a view schematically showing the electrical connection of two through-hole structures.
Figure 4B:
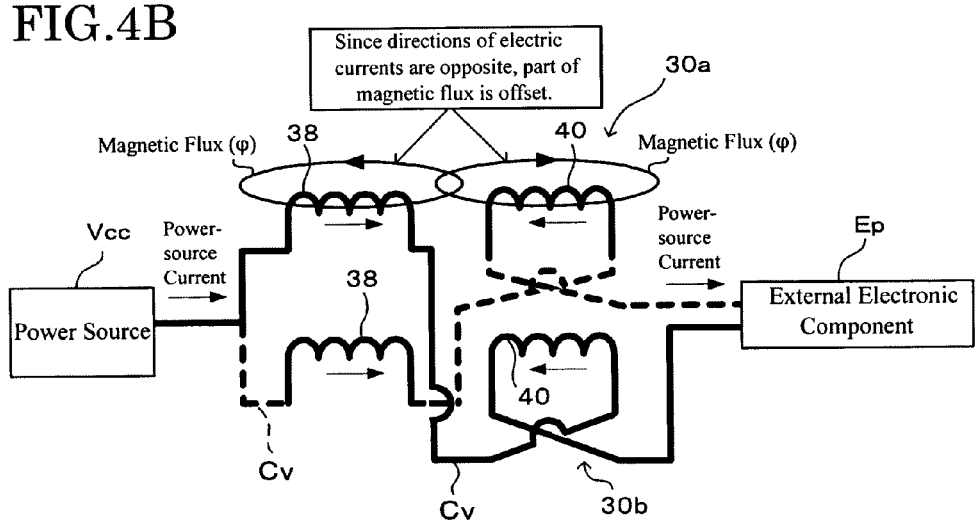
FIG. 4B is another view schematically showing the electrical connection of two through-hole structures.

As shown in FIGS. 4A and 4B, wiring board 10 (core substrate 20) of the present embodiment has first through-hole structure (30a) and second through-hole structure (30b) which are formed with inner through-hole conductor 38 and multiple outer through-hole conductors 40 positioned around inner through-hole conductor 38. Then, outer through-hole conductors 40 in first through-hole structure (30a) are electrically connected to inner through-hole conductor 38 in second through-hole structure (30b). Moreover, inner through-hole conductor 38 in first through-hole structure (30a) is electrically connected to outer through-hole conductors 40 in second through-hole structure (30b). First through-hole structure (30a) and second through-hole structure (30b) are used as power-source through holes. Namely, for example, power source (Vcc) is connected to inner through-hole conductors 38 in first through-hole structure (30a) and second through-hole structure (30b), and outer through-hole conductors 40 in first through-hole structure (30a) and second through-hole structure (30b) are electrically connected to external electronic component (Ep) such as a CPU (Central Processing Unit) or MPU (Micro Processing Unit) mounted on wiring board 10. Then, power-source current from power-source (Vcc) flows through transmission lines (Cv) that connect each node to supply power to each node. Here, as seen in FIGS. 4A and 4B, outer through-hole conductors 40 and inner through-hole conductors 38 are set to have equal electrical potential in first through-hole structure (30a) and second through-hole structure (30b).

In the present embodiment, inductors are formed by outer through-hole conductors 40 and inner through-hole conductor 38 in first through-hole structure (30a) and second through-hole structure (30b) as shown in FIG. 4B. As shown in FIG. 4A, in first through-hole structure (30a) and second through-hole structure (30b), directions of electric current flowing through outer through-hole conductors 40 and inner through-hole conductor 38 are opposite each other, one in an upward direction and the other in a downward direction.

Thus, part of the magnetic flux ($\phi$) generated in the inductors formed respectively by outer through-hole conductors 40 and inner through-hole conductor 38 is offset. Accordingly, impedance in transmission lines decreases in wiring board 10, and malfunctions and operational delays are suppressed from occurring in a CPU or an MPU. Furthermore, because of such structures, the flexibility of designing transmission lines in wiring board 10 or the flexibility of positioning an electronic component to be mounted on wiring board 10 increases. For example, a VRM for constant voltage supply may be positioned near the CPU or MPU.

Furthermore, as previously shown in FIG. 1, core substrate 20 has third through-hole conductor 42 to connect fifth conductive portion (24a-1) and sixth conductive portion (24b-1). Third through-hole conductor 42 is formed by filling plating in third penetrating hole (22b) formed in insulative substrate 22. Third through-hole conductor 42 works as a signal conductor.

Buildup layer 50 is formed on the first surface of core substrate 20 and buildup layer 60 is formed on the second surface of core substrate 20. Buildup layer 50 is made up of first layer 70, second layer 90 and third layer 110 formed in that order from the side of core substrate 20. Also, buildup layer 60 is made up of first layer 80, second layer 100 and third layer 120 formed in that order from the side of core substrate 20. First layer 70 has insulation layer 72 and wiring layer 74, which is formed on the upper surface of insulation layer 72. First layer 80 has insulation layer 82 and wiring layer 84, which is formed on the lower surface of insulation layer 82.

Insulation layer 72 is formed on the first surface of core substrate 20 as shown in FIG. 1. Insulation layer 82 is formed on the second surface of core substrate 20.

Via holes (72a) are formed in insulation layer 72 and via holes (82a) are formed in insulation layer 82. Then, plating is filled in via holes (72a, 82a) to form via conductors 76 and via conductors 86 respectively.

Insulation layers (72, 82) are made of cured prepreg, for example. As for such a prepreg, for example, the following may be used: those made by impregnating a base material such as glass fiber or aramid fiber with a resin such as epoxy resin, polyester resin, bismaleimide-triazine resin (BT resin), imide resin (polyimide), phenol resin or allyl polyphenylene-ether resin (A-PPE resin). Instead of prepreg, liquid or film-type thermosetting resins, thermoplastic resins or compounds of those resins may be used. Furthermore, RCF (resin-coated copper foil) may also be used.

In the present embodiment, via conductors (76, 86) are filled vias. However, via conductors (76, 86) are not limited to such, and they may be conformal vias.

Wiring layer 74 includes conductor (74a) positioned over inner through-hole conductor 38. Conductor (74a) is connected to first conductive portion (24a) by via conductor 76.

Wiring layer 84 includes conductor (84a) positioned under inner through-hole conductor 38. Conductor (84a) is connected to third conductive portion (24b) by via conductor 86.

In the present embodiment, via conductor 76 is positioned substantially along the central axis of inner through-hole conductor 38. However, the position of via conductor 76 is not limited to such, and it may be shifted away from inner through-hole conductor 38 in a direction parallel to the surface of insulative substrate 22. When via conductor 76 is shifted in a direction parallel to the first surface of insulative substrate 22 from the center of inner through-hole conductor 38, via conductor 76 is connected to first conductive portion (24a) with highly flat features, thus ensuring connection reliability.

As shown in FIG. 1, second layer 90 has insulation layer 92 and wiring layer 94, which is formed on the upper surface of insulation layer 92. Also, second layer 100 has insulation layer 102 and wiring layer 104, which is formed on the lower surface of insulation layer 102. In addition, third layer 110 has insulation layer 112 and wiring layer 114, which is formed on the upper surface of insulation layer 112, and third layer 120 has insulation layer 122 and wiring layer 124, which is formed on the lower surface of insulation layer 122.

Via holes (92a) and (102a) are formed in their respective insulation layers 92 and 102. Via conductors 96 and 106, which are filled vias, are formed by filling plating in their respective via holes (92a) and (102a). In addition, wiring layers 94 and 104 are formed respectively on the upper surface of insulation layer 92 and on the lower surface of insulation layer 102. Wiring layer 74 and wiring layer 94 are connected by via conductors 96, and wiring layer 84 and wiring layer 104 are connected by via conductors 106.

Also, insulation layers 112 and 122 are formed respectively on the upper surface of insulation layer 92 and on the lower surface of insulation layer 102. Then, wiring layer 94 and wiring layer 114 are connected by via conductors 116 formed in via holes (112a) in insulation layer 112. Wiring layer 104 and wiring layer 124 are connected by via conductors 126 formed in via holes (122a) in insulation layer 122.

Then, solder-resist layer 131 is formed on the upper surface of insulation layer 112, and solder-resist layer 141 is formed on the lower surface of insulation layer 122. Solder-resist layers (131, 141) are made of resin such as photosensitive resin using acrylic-epoxy resin, thermosetting resin primarily containing epoxy resin, or UV curing resin and so forth.

Openings exposing part of wiring layer 114 and openings exposing part of wiring layer 124 are formed respectively in solder-resist layer 131 and solder-resist layer 141. Part of wiring layer 114 and part of wiring layer 124 are used as solder pads. Solder connection layers (132, 142) are formed on their respective solder pads to enhance solderability. Then, external connection terminals (150, 160) are formed on their respective solder connection layers (132, 142). External connection terminals (150, 160) are used for electrical connection with other wiring boards and electronic components. Moreover, if required, electronic components such as a VRM (Voltage Regulator Module) may be mounted in wiring board 10 for a constant voltage supply to a CPU or an MPU.

Next, a method for manufacturing wiring board 10 is described with reference to FIGS. 5~8.

Forming Core Substrate 20

Figure 5A:
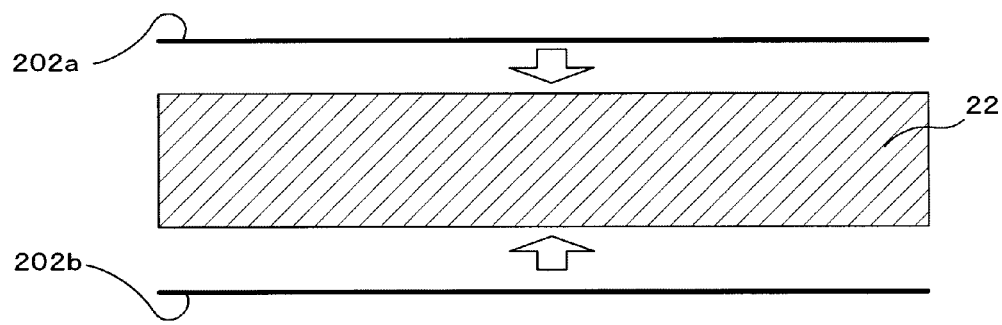
FIG. 5A is a view showing a step for forming a core substrate.

First, as shown in FIG. 5A, copper-clad laminate 200 is prepared by placing copper foil (202a) and copper foil (202b) on a first surface and a second surface of insulative substrate 22 and by pressing them.

Figure 5B:
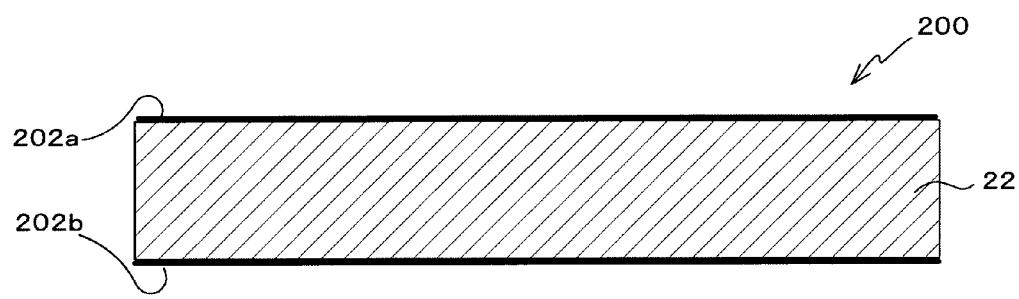
FIG. 5B is subsequent to FIG. 5A, a view showing a step for forming a core substrate.

Accordingly, as shown in FIG. 5B, copper-clad laminate 200 is obtained, being made of insulative substrate 22, copper foil (202a) formed on the first surface of insulative substrate 22 and copper foil (202b) formed on the second surface of insulative substrate 22.

Next, black-oxide treatment is performed on the surfaces of copper foils (202a, 202b) using an oxidation solution. In doing so, copper foils (202a, 202b) are blackened, and laser absorption rates increase during laser processing.

Figure 5C:
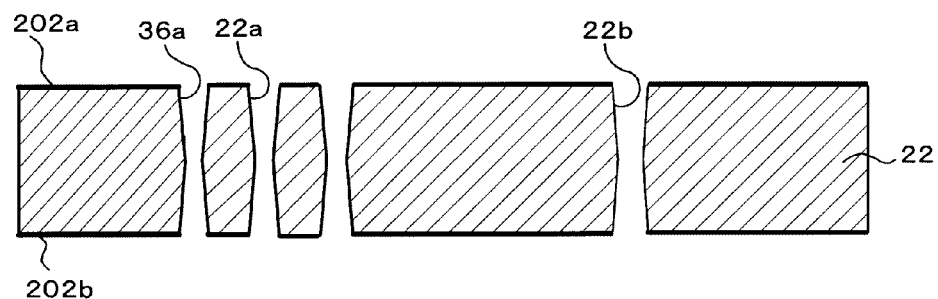
FIG. 5C is subsequent to FIG. 5B, a view showing a step for forming a core substrate.

Next, as shown in FIG. 5C, a laser is used to bore first penetrating hole (22a), second penetrating holes (36a) and third penetrating hole (22b). Here, a carbon-dioxide gas ($CO_2$) laser or a UV-YAG laser, for example, is irradiated on the first and second surfaces of copper-clad laminate 200. Either a laser whose energy is higher in the center than on the periphery, or a laser with multiple pulses is irradiated. When irradiating a laser with multiple pulses, it is preferred to reduce the laser diameter gradually from the first pulse toward the final pulse. Alternatively, a laser whose energy density is higher in the center than on the periphery may be used for the final pulse. The number of laser shots here is not limited specifically. Lasers may be irradiated separately on each surface, or simultaneously on both surfaces.

Multiple second penetrating holes (36a) are each formed at substantially even intervals around first penetrating hole (22a) one at a time or all of them simultaneously with first penetrating hole (22a) positioned at their center. Here, the opening shape of first penetrating hole (22a) and second penetrating holes (36a) is circular. However, their opening shape is not limited to such and it may be oval, for example. Second penetrating holes (36a) may be bored after first penetrating hole (22a) is bored. Alternatively, second penetrating holes (36a) may be bored before first penetrating hole (22a) is bored, or first penetrating hole (22a) and second penetrating holes (36a) may be bored simultaneously.

Third penetrating hole (22b) is formed to have a smaller diameter in the central portion than the opening diameters on the first and second surfaces of insulative substrate 22. However, third penetrating hole (22b) is not limited to being formed as such, and the opening diameter on the second surface may be set smaller than the opening diameter on the first surface. Alternatively, the wall surfaces of third penetrating hole (22b) may be set perpendicular to the first and second surfaces.

In the present embodiment, the opening shape of third penetrating hole (22b) is circular. However, it is not limited to such, and it may be oval, for example. Also, in the present embodiment, a laser is used to bore first penetrating hole (22a), second penetrating holes (36a) and third penetrating hole (22b). However, boring the holes is not limited to using a laser, and a drill may also be used. In such a case, the diameters of penetrating holes are substantially the same in a thickness direction of insulative substrate 22.

Figure 5D:
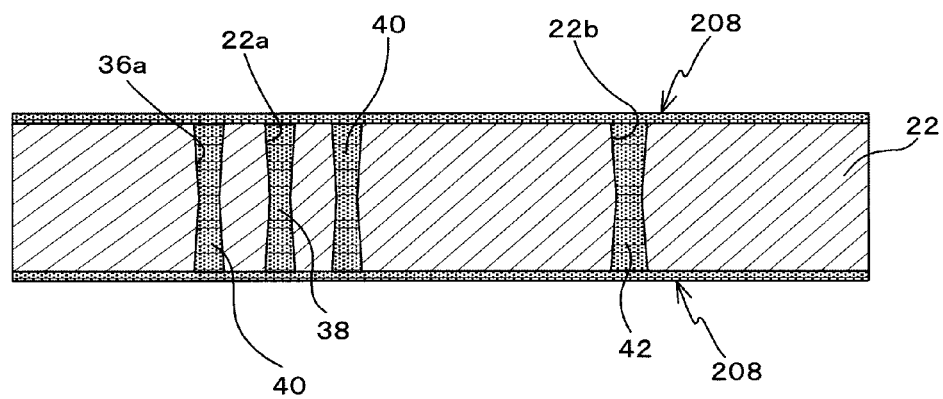
FIG. 5D is subsequent to FIG. 5C, a view showing a step for forming a core substrate.

Next, as shown in FIG. 5D, electroless plating and electrolytic plating are performed to form plated film 208 made of copper, for example, in first penetrating hole (22a), second penetrating holes (36a) and third penetrating hole (22b) as well as on substrate surfaces. Plating film 208 is made up of electroless plated film (208a) and electrolytic plated film (208b) (FIG. 2L). Then, first penetrating hole (22a), second penetrating holes (36a) and third penetrating hole (22b) are filled with plating, and outer through-hole conductors 40, inner through-hole conductor 38 and third through-hole conductor 42 are formed respectively. Here, outer through-hole conductors 40, inner through-hole conductor 38 and third through-hole conductor 42 are made from copper. However, they may also be made from other conductive material such as nickel. Also, in the present embodiment, outer through-hole conductors 40 and inner through-hole conductor 38 are formed by pulse plating or direct-current plating. In doing so, voids are suppressed from occurring.

Figure 5E:
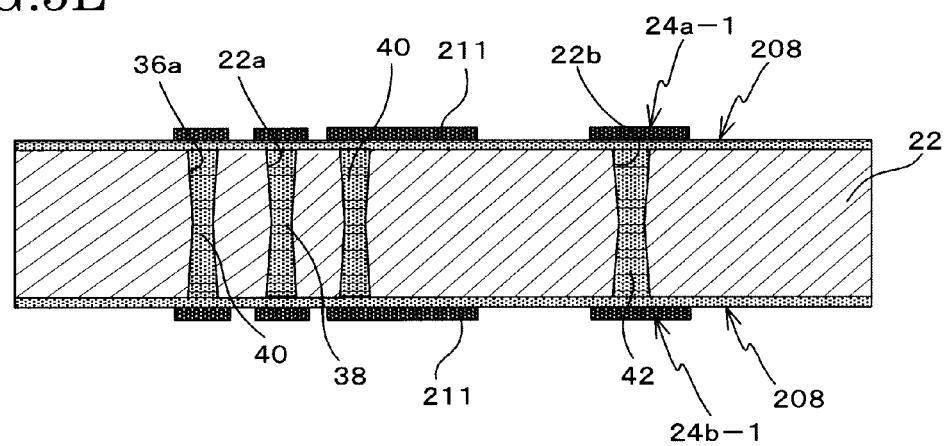
FIG. 5E is subsequent to FIG. 5D, a view showing a step for forming a core substrate.
Figure 5F:
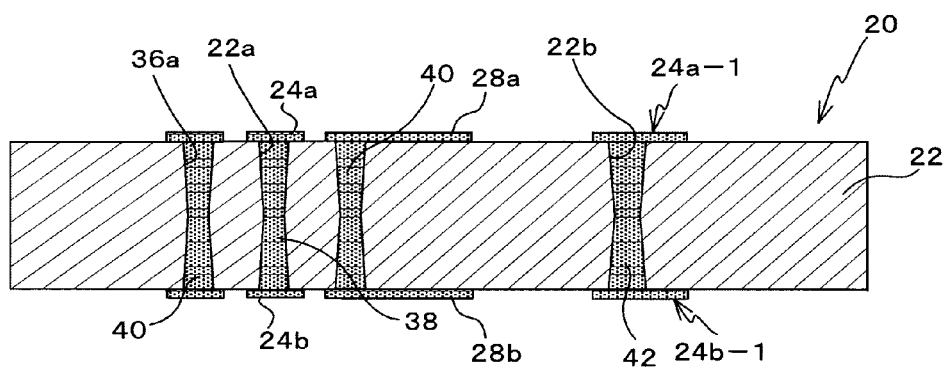
FIG. 5F is subsequent to FIG. 5E, a view showing a step for forming a core substrate.

Next, as shown in FIG. 5E, the plated films are patterned by a tenting method using etching resists 211. Namely, to protect portions to form a pattern and inner through-hole conductor 38, they are covered with etching resists 211 having openings, then the plated film (conductive layer) exposed through the openings is etched. Accordingly, as shown in FIG. 5F, conductive portions (24a, 24b, 28a, 28b) are formed. The width of first conductive portion (24a) and third conductive portion (24b) is set greater than inner through-hole conductor 38, and the width of second conductive portion (28a) and fourth conductive portion (28b) is set greater than outer through-hole conductor 40.

Then, if required, surfaces of conductive portions (24a, 24b, 28a, 28b) are roughened by etching, for example. In doing so, adhesiveness is enhanced between first conductive portion (24a), third conductive portion (24b), second conductive portion (28a) and fourth conductive portion (28b) and insulation layers (72, 82) which are formed as their upper layers (see FIG. 6). Core substrate 20 is obtained through the above procedures.

Forming Buildup Layer 50 and Buildup Layer 60

Figure 6A:
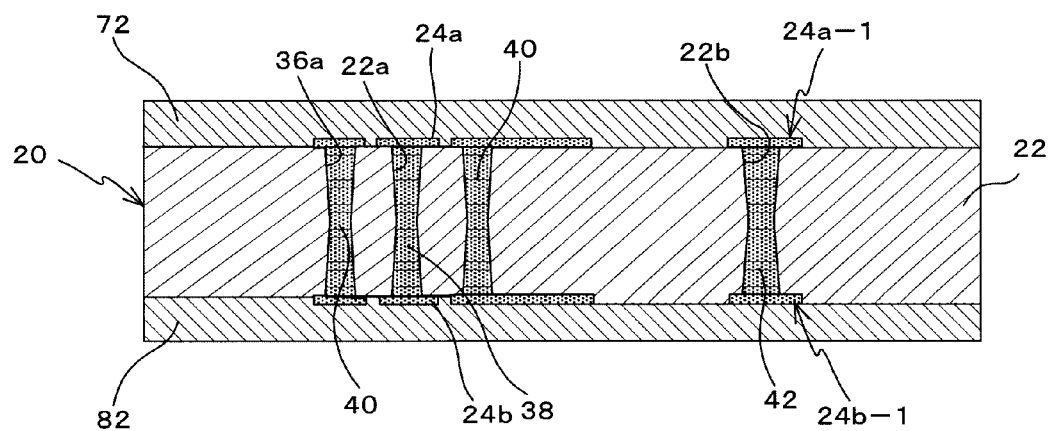
FIG. 6A is subsequent to FIGS. 5A~F which show the steps for forming a core substrate, a view showing a step for forming buildup layers.

Next, film-type thermosetting resin is placed on the first and second surfaces of core substrate 20, which are then thermal pressed. Accordingly, as shown in FIG. 6A, insulation layers (72, 82) are formed respectively on the first surface and the second surface of core substrate 20. Insulation layers (72, 82) may also be formed by coating with liquid-type thermosetting resin using a method such as a screen printing method and a curtain-coating method.

Figure 6B:
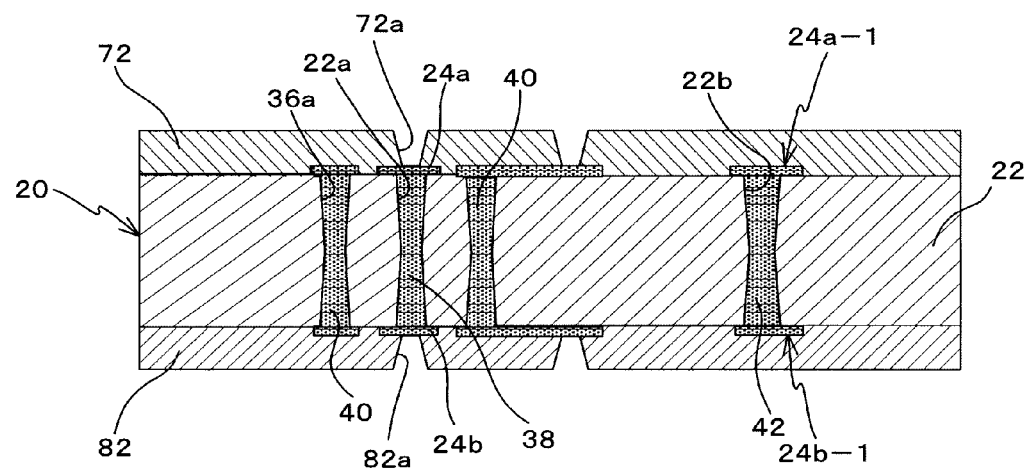
FIG. 6B is subsequent to FIG. 6A, a view showing a step for forming buildup layers.

After that, as shown in FIG. 6B, a laser is used to bore via holes (72a, 82a) in their respective insulation layers (72, 82). Here, via holes (72a, 82a) are bored so that their central axes correspond to the central axis of inner through-hole conductor 38. Then, to remove smearing or the like remaining at the bottoms of via holes (72a, 82a), desmearing treatment is performed.

Next, as shown in FIGS. 6C~6F, wiring layer 74 which includes conductor (74a) and wiring layer 84 which includes conductor (84a) are formed on insulation layer 72 and insulation layer 82 respectively.

Figure 6C:
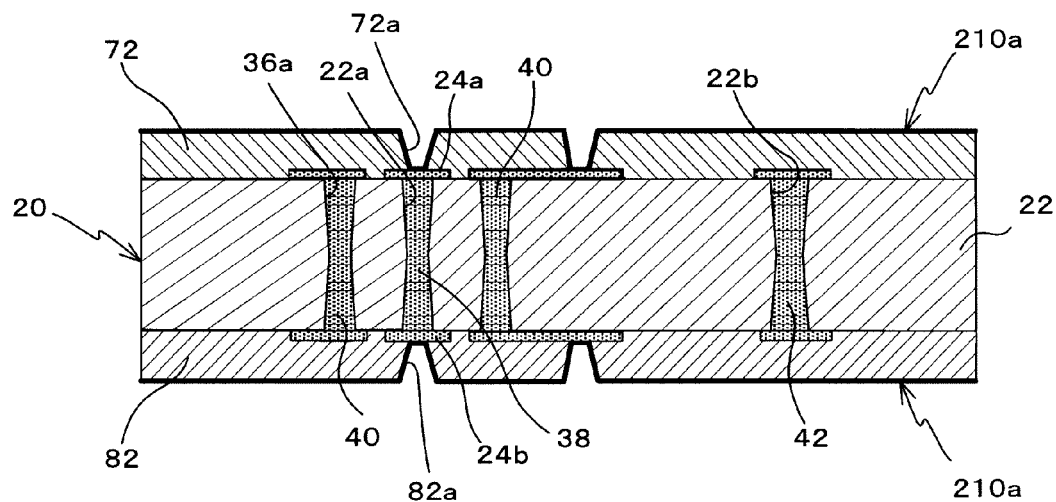
FIG. 6C is subsequent to FIG. 6B, a view showing a step for forming buildup layers.

Specifically, the laminate shown in FIG. 6B is immersed in a solution containing a catalyst such as palladium. Accordingly, the catalyst is adsorbed on the surfaces of insulation layers (72, 82). Then, as shown in FIG. 6C, the substrate with adsorbed catalyst is immersed in an electroless copper plating solution to form electroless plated film (210a) on the surfaces of insulation layers (72, 82).

Figure 6D:
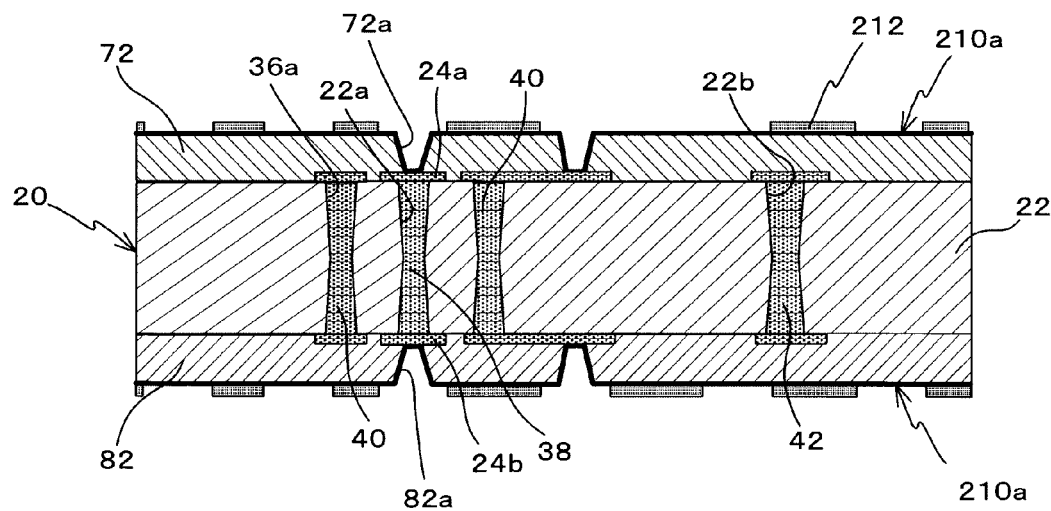
FIG. 6D is subsequent to FIG. 6C, a view showing a step for forming buildup layers.

After that, a dry-film photosensitive resist is laminated on both surfaces of the laminate. Then, a mask film with a predetermined pattern is adhered to each photosensitive resist, which is then exposed to ultraviolet rays and developed with an alkaline solution. Accordingly, as shown in FIG. 6D, plating resist layers 212 are formed having openings in regions where conductors are formed later.

Figure 6E:
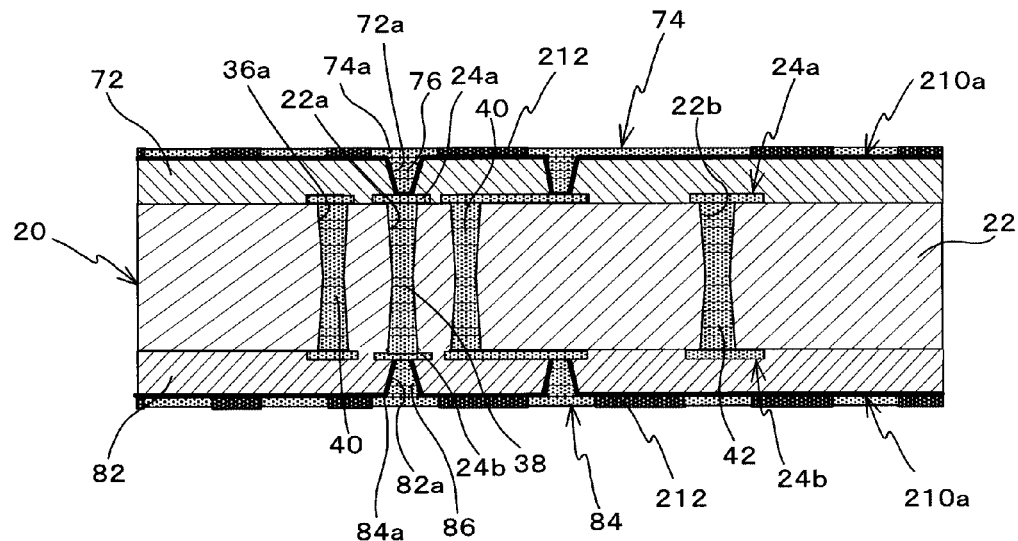
FIG. 6E is subsequent to FIG. 6D, a view showing a step for forming buildup layers.

Next, after the laminate is washed with water and dried, electrolytic plating is performed using the electroless plated film as a seed layer. Accordingly, as shown in FIG. 6E, wiring layer 74 having conductor (74a) and wiring layer 84 having conductor (84a) are formed in their respective openings in plating resist layers 212. During that time, via holes (72a, 82a) are filled with plating, and via conductors (76, 86) are formed respectively.

Here, via conductors (76, 86) are formed so that each central axis corresponds to the central axis of inner through-hole conductor 38.

Figure 6F:
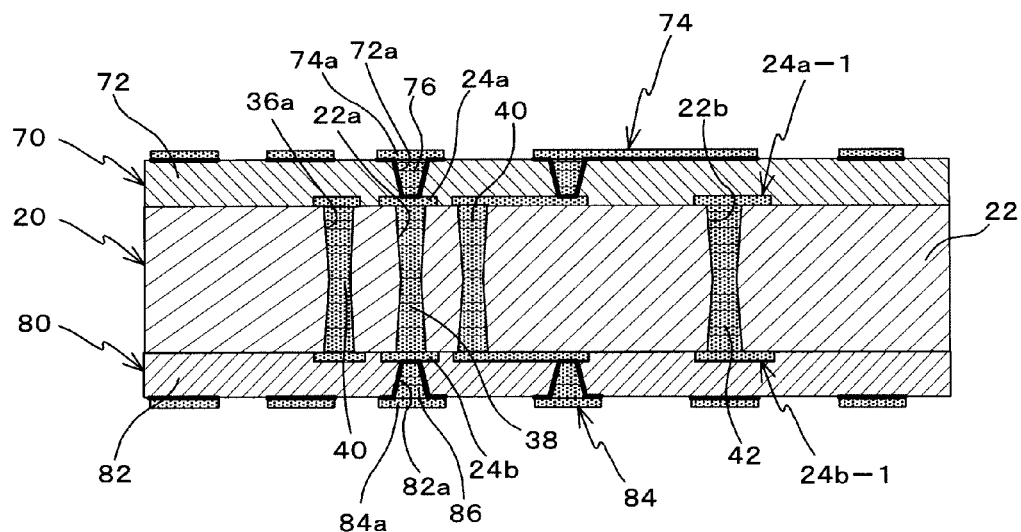
FIG. 6F is subsequent to FIG. 6E, a view showing a step for forming buildup layers.

Next, plating resist layers 212 are removed, and the laminate is washed with water and dried. Then, exposed electroless plated film (210a) is removed by etching. Accordingly, as shown in FIG. 6F, a laminate is obtained where first layers (70, 80) are laminated respectively on the upper and lower surfaces of core substrate 20.

Figure 6G:
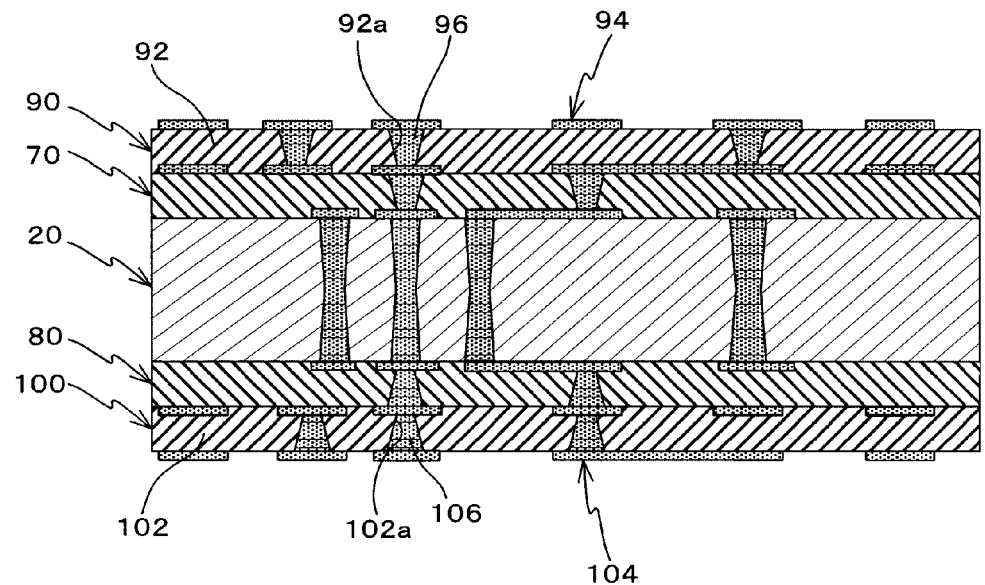
FIG. 6G is subsequent to FIG. 6F, a view showing a step for forming buildup layers.
Figure 6H:
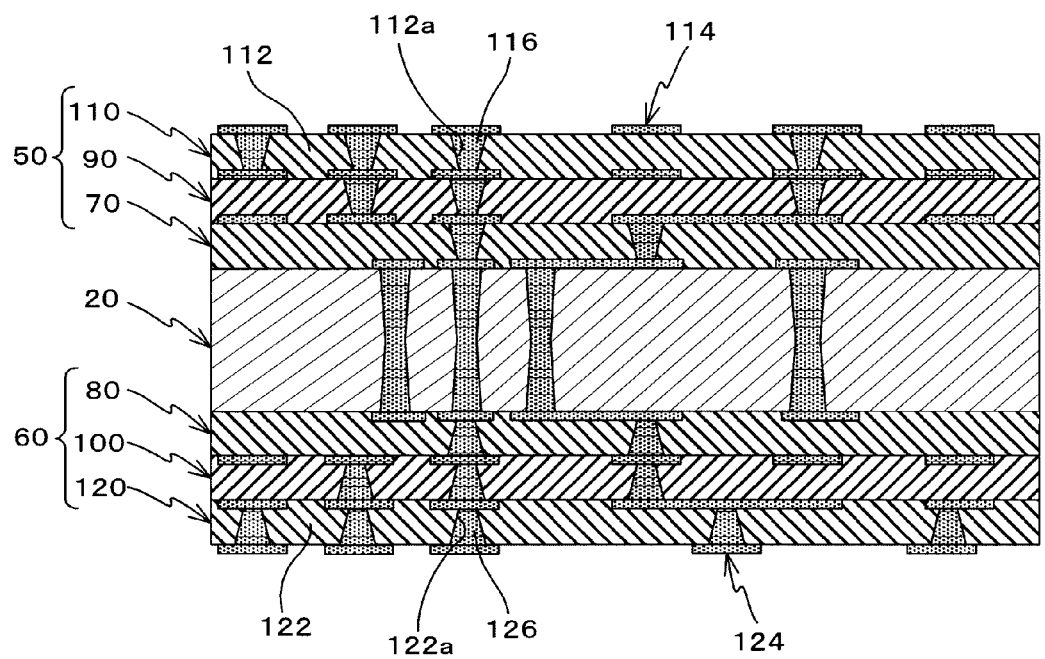
FIG. 6H is subsequent to FIG. 6G, a view showing a step for forming buildup layers.

Then, by repeating the steps shown in FIGS. 6C~6F, second layers (90, 100) and third layers (110, 120) are formed in that order on the upper and lower surfaces of core substrate 20 as shown in FIGS. 6G and 6H. Accordingly, a laminate is obtained where buildup layers (50, 60) are laminated on core substrate 20.

Here, in wiring board 10 (core substrate 20), first through-hole structure (30a) and second through-hole structure (30b) are formed, being made up of inner through-hole conductor 38 and multiple outer through-hole conductors 40 (see FIG. 4A). Then, outer through-hole conductors 40 in first through-hole structure (30a) are electrically connected to inner through-hole conductor 38 in second through-hole structure (30b). Furthermore, inner through-hole conductor 38 in first through-hole structure (30a) is electrically connected to outer through-hole conductors 40 in second through-hole structure (30b).

Forming Solder-Resist Layer 131 and Solder-Resist Layer 141

Figure 7A:
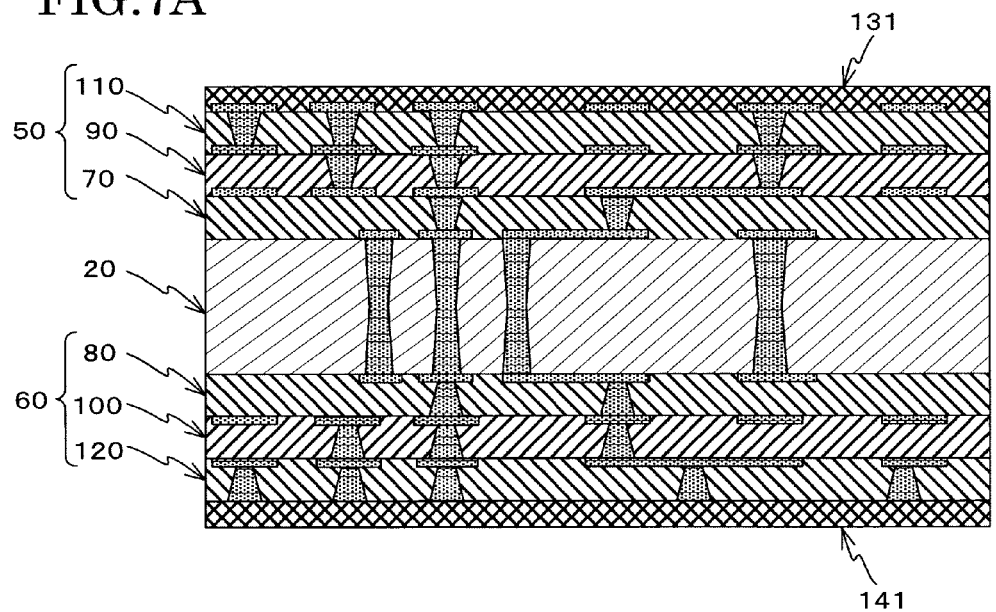
FIG. 7A is subsequent to FIGS. 6A~H which show the steps for forming buildup layers, a view showing a step for forming solder-resist layers.

Next, on the upper and lower surfaces of the laminate shown in FIG. 6H, liquid or dry-film photosensitive resist (solder resist) is either applied or laminated to form solder-resist layers (131, 141) on the upper and lower surfaces of the laminate as shown in FIG. 7A.

Figure 7B:
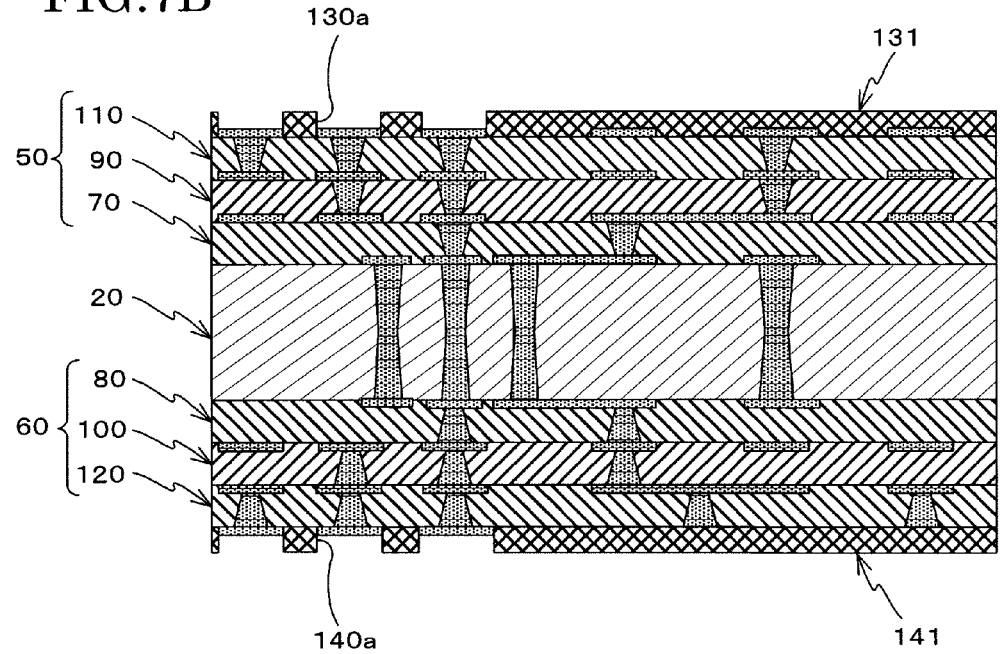
FIG. 7B is subsequent to FIG. 7A, a view showing a step for forming solder-resist layers.

Then, a photomask film having a conductive pattern (opening portions) is adhered on the surfaces of solder-resist layers (131, 141), exposed to ultraviolet rays and developed with an alkaline solution. Accordingly, as shown in FIG. 7B, opening portions (130a, 140a) are formed in solder-resist layers (131, 141). Such opening portions (130a, 140a) are for exposing the portions which later become solder pads in wiring layers (114, 124).

Surface Treatment

Figure 8A:
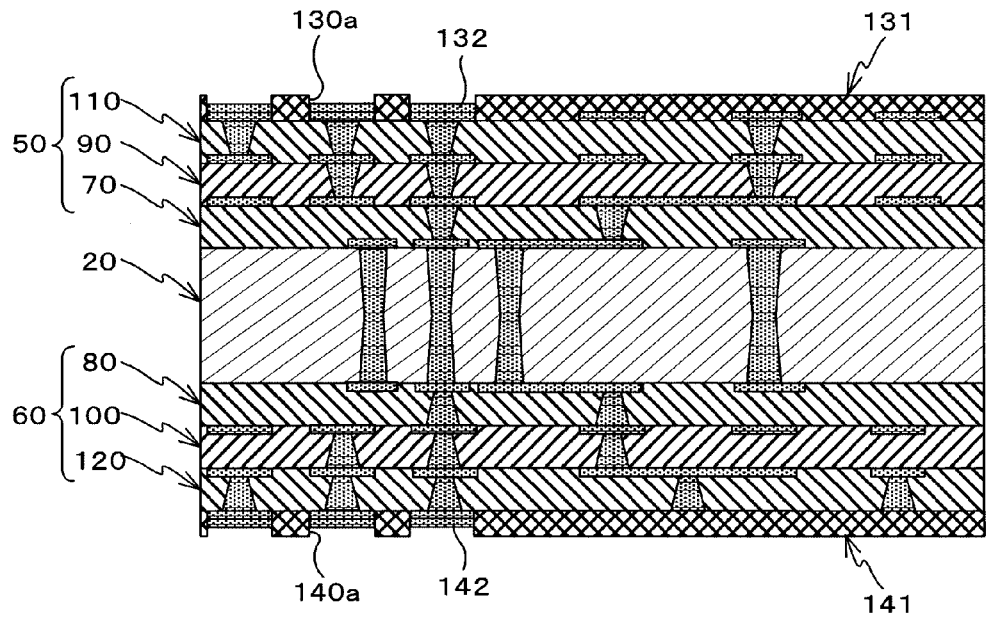
FIG. 8A is subsequent to FIGS. 7A~B which show the steps for forming buildup layers, a view showing a step for surface treatment.

Next, as shown in FIG. 8A, solder connection layers (132, 142) are formed in opening portions (130a, 140a) respectively. Solder connection layers (132, 142) are plating layers to enhance the solderability of solder pads, and are made up of a nickel-plated layer and a gold-plated layer.

A nickel-plated layer is formed by immersing the laminate in an electroless nickel plating solution, and a gold-plated layer is formed by immersing the laminate in an electroless gold plating solution. Here, solder connection layers (132, 142) may also be formed as a triple-plated layer of nickel-palladium-gold. Alternatively, solder connection layers (132, 142) may be formed as a single-plated layer of gold, silver, tin or the like, or they may be formed with a resin film such as flux.

Figure 8B:
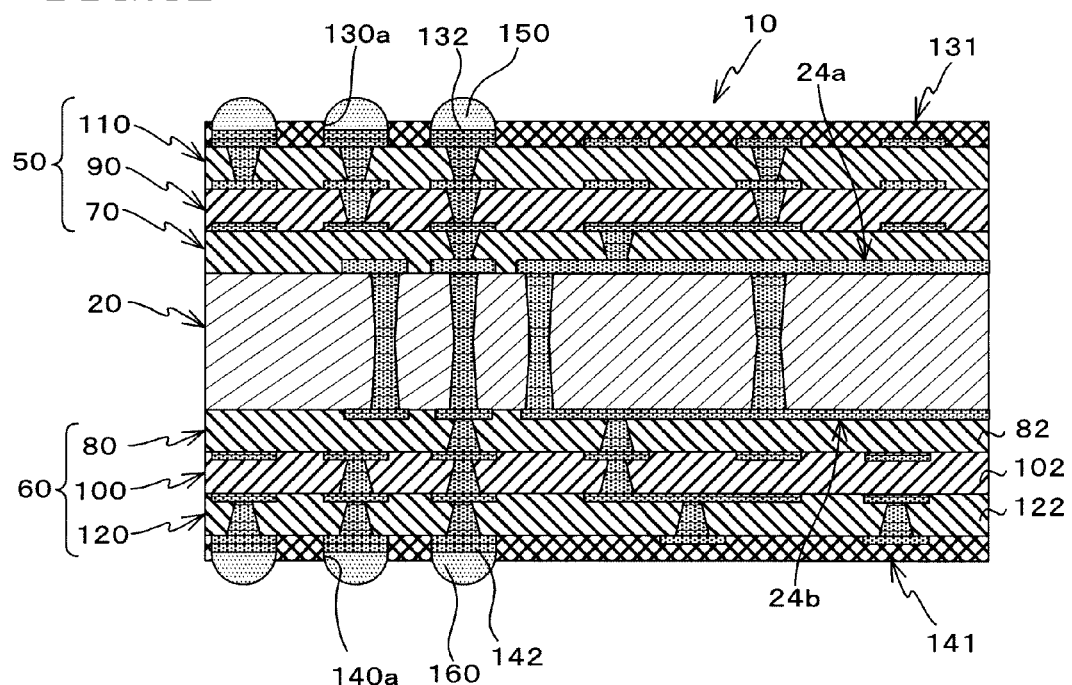
FIG. 8B is subsequent to FIG. 8A, a view showing a step for surface treatment.

Next, as shown in FIG. 8B, solder paste is printed on solder connection layers (132, 142), and reflowed to form external connection terminals (150, 160). Accordingly, wiring board 10 is manufactured.

In the present embodiment, the direction of the current in multiple outer through-hole conductors 40 and the direction of the current in inner through-hole conductor 38 are set opposite from each other. In doing so, part of the magnetic fields generated by the current flowing in each outer through-hole conductor 40 and part of the magnetic fields generated by the current flowing in inner through-hole conductor 38 are offset from each other. Accordingly, impedance in transmission lines decreases and malfunctions and operational delays are suppressed from occurring in a CPU or MPU.

Also, since impedance in transmission lines decreases, voltage loss is reduced. Thus, chip capacitors are not required to be inserted in transmission lines for a constant voltage supply. As a result, manufacturing costs decrease.

Also, in the present embodiment, by forming VRM inductors in a wiring board so as to install a VRM in the wiring board, voltage for a CPU is supplied without loss. Accordingly, the number of chip capacitors required to supply power at a constant voltage is reduced.

Figure 9:
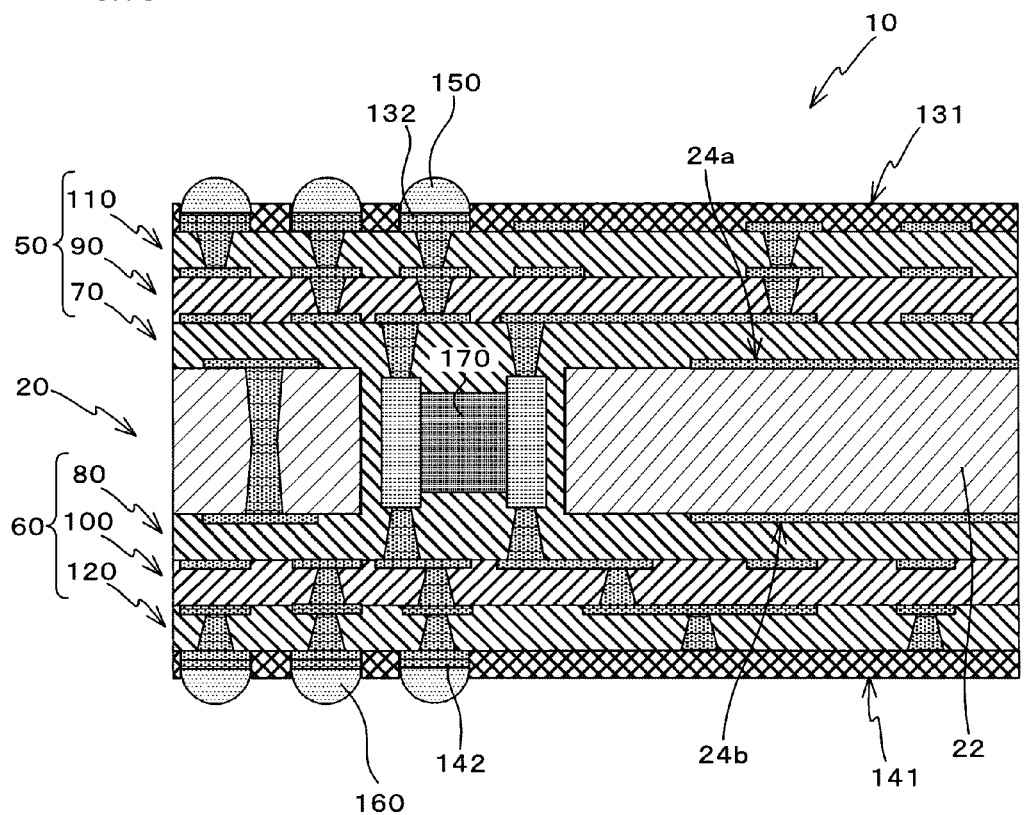
FIG. 9 is a cross-sectional view showing a modified example of a wiring board according to an embodiment of the present invention.
Figure 10:
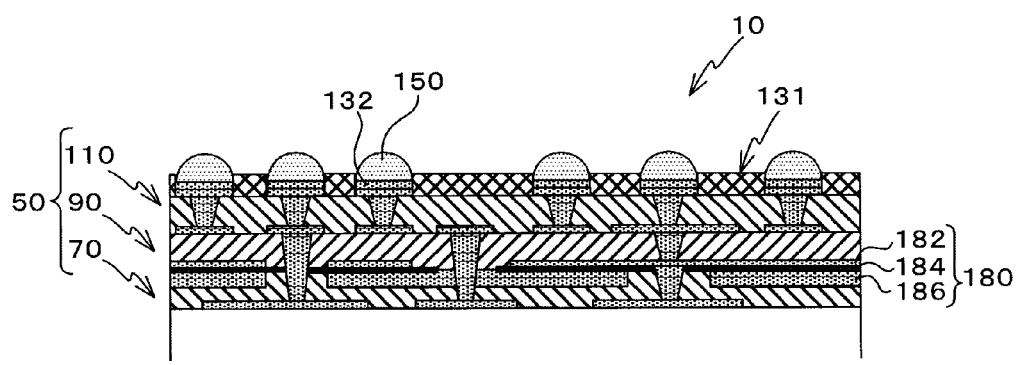
FIG. 10 is a cross-sectional view showing a modified example of a wiring board according to an embodiment of the present invention.

Moreover, a capacitor required for a VRM may be arranged in a wiring board. For example, as shown in FIG. 9, chip capacitor 170 may be formed in insulative substrate 22. Furthermore, as shown in FIG. 10, thin-film capacitor 180 may also be formed on an insulation layer. Such thin-film capacitor 180 is made of a pair of opposing electrodes (182, 186) and of ceramic dielectric layer 184 sandwiched between the electrodes.

A wiring board according to the present invention is not limited to the above embodiment, and various modifications may be made within a scope that does not deviate from the gist of the invention.

For example, in the above embodiment, the quality, size, number of layers and so forth may be modified freely in each layer.

Also, in wiring board 10 of the above embodiment, buildup layers (50, 60) formed on both surfaces of core substrate 20 have a triple-layer structure with first layer 70, second layer 90 and third layer 110, and with first layer 80, second layer 100 and third layer 120 respectively. However, the present embodiment is not limited to such, and the layers may have a single-layer structure or a double-layer structure. Alternatively, they may have a structure of four or more layers. In addition, the number of layers in buildup layers (50, 60) may be different from each other. Furthermore, such a buildup layer may be formed only on one main surface. Yet alternatively, external connection terminals for connection with electronic components may be formed only on one main surface of the wiring board.

In the method for manufacturing a wiring board described in the above embodiment, the order may be modified properly within a scope that does not deviate from the gist of the present invention. Also, some steps may be omitted according to usage requirements or the like. For example, conductive patterns of wiring layers may be formed by a semi-additive method, a subtractive method or any other method.

A wiring board according to one aspect of the present invention has the following: a substrate with a first surface and a second surface and having a first penetrating hole and second penetrating holes formed around the first penetrating hole; a first conductive portion formed on the first surface of the substrate; a second conductive portion formed on the first surface of the substrate to be positioned around the first conductive portion; a third conductive portion formed on the second surface of the substrate; a fourth conductive portion formed on the second surface of the substrate to be positioned around the third conductive portion; a first through-hole conductor formed in the first penetrating hole and electrically connecting the first conductive portion and the third conductive portion; and multiple second through-hole conductors formed in the first penetrating hole and electrically connecting the second conductive portion and the fourth conductive portion. In such a wiring board, the first through-hole conductor and the second through-hole conductors are made of conductive material filled in the first penetrating hole or the second penetrating holes.

A method for manufacturing a wiring board according to another aspect of the present invention includes the following: preparing a substrate having a first surface and a second surface; forming a first penetrating hole in the substrate while forming second penetrating holes around the first penetrating hole; on the first surface of the substrate, forming a first conductive portion and a second conductive portion positioned around the first conductive portion; on the second surface of the substrate, forming a third conductive portion and a fourth conductive portion positioned around the third conductive portion; in the first penetrating hole, forming a first through-hole conductor which connects the first conductive portion and the third conductive portion; and in the second penetrating holes, forming multiple second through-hole conductors which connect the second conductive portion and the fourth conductive portion. In such a method, the first through-hole conductor and the second through-hole conductors are formed by filling a conductive material in the first penetrating hole and the second penetrating holes.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a substrate having a first penetrating hole and a plurality of second penetrating holes formed around the first penetrating hole;
   a first conductive portion formed on a first surface of the substrate and positioned at a first end portion of the first penetrating hole;
   a second conductive portion formed on the first surface of the substrate and positioned at first end portions of the second penetrating holes around the first conductive portion;
   a third conductive portion formed on a second surface of the substrate on an opposite side of the first surface and positioned at a second end portion of the first penetrating hole;
   a fourth conductive portion formed on the second surface of the substrate and positioned at second end portions of the second penetrating holes around the third conductive portion;
   a first through-hole conductor formed in the first penetrating hole and comprising a conductive material filling the first penetrating hole of the substrate, the first through-hole conductor electrically connecting the first conductive portion and the third conductive portion;
   a plurality of second through-hole conductors formed in the second penetrating holes and comprising a conductive material filling the second penetrating holes, the plurality of second through-hole conductors electrically connecting the second conductive portion and the fourth conductive portion; and
   a second through-hole structure comprising a third through-hole conductor and a plurality of fourth through-hole conductors formed around the third through-hole conductor,
   wherein the substrate includes a reinforcing material having portions protruding into the first through-hole conductor and second through-hole conductors, respectively, the first through-hole conductor and second through-hole conductors form a first through-hole structure, the first through-hole conductor in the first through-hole structure is electrically connected to the plurality of fourth through-hole conductors in the second through-hole structure, and the second through-hole conductors in the first through-hole structure are electrically connected to the third through-hole conductor in the second through-hole structure.

2. The wiring board according to claim 1, wherein at least one of the conductive materials of the first through-hole conductor and the plurality of second through-hole conductors is a copper plating.

3. The wiring board according to claim 1, wherein the second through-hole structure is formed in the substrate, and the first through-hole structure has an electrical potential which is equal to an electrical potential of the second through-hole structure.

4. The wiring board according to claim 1, wherein the second through-hole structure is formed in the substrate, and the first through-hole structure and second through-hole structure are power-source conductors.

5. The wiring board according to claim 1, wherein the first conductive portion and the second conductive portion are formed such that the first conductive portion and the second conductive portion are separated from each other.

6. The wiring board according to claim 1, wherein the second conductive portion has a substantially annular shape.

7. The wiring board according to claim 1, wherein the second through-hole conductors are positioned at even intervals in a circumferential direction of the first through-hole conductor.

8. The wiring board according to claim 1, wherein the first through-hole conductor and the second through-hole conductors are configured such that in the first through-hole conductor and the second through-hole conductors, currents flow in opposite directions.

9. The wiring board according to claim 1, wherein the first through-hole conductor and the second through-hole conductors form inductors.

10. The wiring board according to claim 1, wherein the substrate comprises the reinforcing material impregnated with a resin.

11. The wiring board according to claim 1, wherein the reinforcing material is a glass fiber material, and the substrate comprises the glass fiber material impregnated with a resin.

12. The wiring board according to claim 1, further comprising a buildup layer formed on the first surface of the substrate.

13. The wiring board according to claim 1, wherein each of the first through-hole conductor and second through-hole conductors has a cylindrical shape having a narrower central portion.

14. The wiring board according to claim 1, further comprising:
a first buildup layer formed on the first surface of the substrate; and
a second buildup layer formed on the second surface of the substrate.

15. The wiring board according to claim 1, wherein each of the first through-hole conductor and second through-hole conductors has a cylindrical shape having a narrower central portion, and the first through-hole conductor and second through-hole conductors comprise a plating material substantially filling the first penetrating hole and second penetrating holes, respectively.

16. The wiring board according to claim 1, wherein each of the first conductive portion, second conductive portion, third conductive portion and fourth conductive portion comprises a copper foil portion, an electroless plated film portion formed on the copper foil portion and an electrolytic plated film portion formed on the electroless plated film portion, and the first through-hole conductor and second through-hole conductors comprise electroless plated film portions formed on wall surfaces of the first penetrating hole and second penetrating holes and electrolytic plated film portions filling spaces encapsulated by the electroless plated film portions, respectively.

17. The wiring board according to claim 1, wherein the first through-hole conductor and second through-hole conductors comprise electroless plated film portions formed on wall surfaces of the first penetrating hole and second penetrating holes and electrolytic plated film portions filling spaces encapsulated by the electroless plated film portions, respectively.

18. The wiring board according to claim 1, wherein each of the first through-hole conductor, second through-hole conductors, third through-hole conductor and fourth through-hole conductors has a cylindrical shape having a narrower central portion.

19. The wiring board according to claim 1, wherein the third through-hole conductor is formed in a third penetrating hole formed thorough the substrate, the plurality of fourth through-hole conductors is formed on a plurality of fourth penetrating holes formed through the substrate around the third through-hole conductor, and each of the first through-hole conductor, second through-hole conductors, third through-hole conductor and fourth through-hole conductors has a cylindrical shape having a narrower central portion, and the first through-hole conductor, second through-hole conductors, third through-hole conductor and fourth through-hole conductors comprise a plating material substantially filling the first penetrating hole, second penetrating holes, third penetrating hole and fourth penetrating holes, respectively.

* * * * *